United States Patent
Shin et al.

(10) Patent No.: US 7,119,029 B2
(45) Date of Patent: Oct. 10, 2006

(54) METHOD OF OXIDIZING A SILICON SUBSTRATE AND METHOD OF FORMING AN OXIDE LAYER USING THE SAME

(75) Inventors: Won-Sik Shin, Seoul (KR); Ki-Hyun Hwang, Sungnam-si (KR); Jung-Hwan Oh, Suwon-si (KR); Hyeon-Deok Lee, Seoul (KR); Seok-Woo Nam, Yongin-si (KR)

(73) Assignee: Samsung Electronics, Co., Ltd., (KR)

( * ) Notice: Subject to any disclaimer, the term of this patent is extended or adjusted under 35 U.S.C. 154(b) by 332 days.

(21) Appl. No.: 10/839,501

(22) Filed: May 5, 2004

(65) Prior Publication Data

US 2004/0224532 A1 Nov. 11, 2004

(30) Foreign Application Priority Data

May 6, 2003 (KR) .................. 10-2003-0028649

(51) Int. Cl.
*H01L 23/48* (2006.01)
(52) U.S. Cl. .......................... 438/756; 438/758
(58) Field of Classification Search ............. 438/758, 438/756
See application file for complete search history.

(56) References Cited

U.S. PATENT DOCUMENTS

| | | | | |
|---|---|---|---|---|
| 5,459,108 A | | 10/1995 | Doi et al. ............... 437/238 |
| 5,792,326 A | * | 8/1998 | Harada et al. ........... 204/176 |
| 6,024,887 A | * | 2/2000 | Kuo et al. ................ 216/48 |
| 6,100,163 A | * | 8/2000 | Jang et al. ............... 438/437 |
| 6,380,056 B1 | * | 4/2002 | Shue et al. .............. 438/591 |
| 6,420,279 B1 | | 7/2002 | Ono ........................ 438/785 |
| 6,713,127 B1 | * | 3/2004 | Subramony et al. ... 427/255.37 |

FOREIGN PATENT DOCUMENTS

| | | |
|---|---|---|
| KR | 97-005678 | 4/1997 |
| KR | 10-0330749 | 4/2002 |
| KR | 2003-0003046 | 1/2003 |

\* cited by examiner

*Primary Examiner*—Thao P. Le
(74) *Attorney, Agent, or Firm*—Mills & Onello LLP

(57) ABSTRACT

In a method of forming an oxide layer, ozone is generated by reacting an oxygen gas having a first flow rate with a nitrogen gas having a second flow rate of more than about 1% of the first flow rate. A reactant including the ozone and nitrogen is provided onto a silicon substrate. A surface of the silicon substrate is oxidized via the reaction of the reactant with silicon in the silicon substrate. The flow rate of the nitrogen gas is increased while ozone serving as an oxidant is formed by reacting the nitrogen gas with the oxygen gas. Thus, the oxide layer or a metal oxide layer including nitrogen may be rapidly formed on the substrate.

14 Claims, 8 Drawing Sheets

METHOD OF OXIDIZING A SILICON SUBSTRATE AND METHOD OF FORMING AN OXIDE LAYER USING THE SAME

CROSS REFERENCE TO RELATED APPLICATION

This application claims priority under 35 USC § 119 to Korean Patent Application No. 2003-28649, filed on May 6, 2003, the contents of which are herein incorporated by reference in their entirety for all purposes.

BACKGROUND OF THE INVENTION

1. Field of the Invention

The present invention relates to a method of oxidizing a silicon substrate and a method of forming an oxide layer. More particularly, the present invention relates to a method of oxidizing a silicon substrate using a nitrogen gas to thereby form an excellent oxide layer on the substrate, and a method of forming an oxide layer or a metal oxide layer on a substrate.

2. Description of the Related Art

Generally, semiconductor devices include various circuit patterns electrically connected to each other. The semiconductor device may be operated by transmitting electric signals from one circuit pattern to another circuit pattern. As the integration degree of semiconductor devices has increased, the sizes of the circuit patterns may be greatly reduced and the circuit patterns may be highly stacked. That is, as the design rule of semiconductor devices decreases, the size and thickness of the circuit patterns also decrease.

In particular, the reduction of the design rule affects the dimension of a dielectric layer of the semiconductor device. The semiconductor device generally includes several dielectric layers such as a gate dielectric layer and a capacitor dielectric layer. A gate dielectric layer, for example, has a thickness of less than about 1 nm when the semiconductor device has a design rule of below about 100 nm. When the gate dielectric layer of less than about 1 nm is formed on a semiconductor substrate, leakage current may be generated from the gate dielectric layer due to a tunneling effect thereof. Since the leakage current may cause a failure of the semiconductor device, a dielectric layer having high dielectric constant to ensure a sufficient capacitance without the generation of the leakage current is desirable.

Dielectric materials having high dielectric constant, for example, include hafnium oxide ($HfO_2$), zirconium oxide ($ZrO_2$), aluminum oxide ($Al_2O_3$), rare earth metal oxide, etc. When a dielectric layer is formed using the dielectric material having a high dielectric constant, much leakage current may be generated from the dielectric layer although the dielectric layer may have high dielectric constant.

To reduce the leakage current of the dielectric layer, nitrogen may be incorporated in a metal oxide layer serving as the dielectric layer. Here, nitrogen may be incorporated in the metal oxide layer by nitrification of the metal oxide layer by a rapid thermal nitration (RTN) process or a plasma RTN process after forming the metal oxide layer. An additional annealing process should be performed to incorporate nitrogen into the metal oxide layer in the RTN process and the plasma RTN process. In addition, nitrogen may not be properly incorporated in the metal oxide layer by the RTN process or the plasma RTN process.

Recently, an atomic layer deposition (ALD) process has been widely used to form a thin oxide film having good uniformity on a substrate. According to the ALD process, the oxide film may be formed on the substrate by the atomic unit. There are drawbacks when the oxide layer is formed by the conventional ALD process such as greatly increased time for forming the oxide layer and deteriorated characteristics of the oxide film.

SUMMARY OF THE INVENTION

The present invention provides a method of rapidly oxidizing a silicon substrate using a nitrogen gas without any additional process.

The present invention also provides a method of rapidly forming an excellent oxide layer including nitrogen on a silicon substrate.

The present invention still also provides a method of rapidly forming an excellent metal oxide layer including nitrogen on a silicon substrate.

In accordance with one aspect of the present invention, there is provided a method of oxidizing a silicon substrate. In one embodiment of the method, ozone is generated by reacting an oxygen gas having a first flow rate with a nitrogen gas having a second flow rate, the second flow rate of more than about 1% (wherein the flow rates are measured in comparable unit of volume per unit of time), preferably about 1–20%, more preferably 2–10%, relative to that of the first flow rate, to form reactant stream including ozone and nitrogen. The reactant stream including ozone and nitrogen is then provided onto a silicon substrate. A surface of the silicon substrate is oxidized by reacting the reactant with silicon included in the silicon substrate, and at the same time, nitrogen is incorporated into the oxide layer formed along the surface. The reactant may include nitrogen molecule, activated nitrogen ions or activated radicals including nitrogen. The second flow rate may be about 2% relative to that of the first flow rate.

In accordance with another aspect of the present invention, there is provided a method of forming an oxide layer on or by reacting an adsorption film formed on a substrate. In one embodiment of this method, ozone is generated by reacting an oxygen gas having a first flow rate with a nitrogen gas having a second flow rate, the second flow rate being more than about 1%, preferably about 1–20%, more preferably about 2–10%, relative to that of the first flow rate, to form a reactant stream including ozone and nitrogen. The reactant stream is then provided onto an adsorption film formed on a silicon substrate. An oxide layer is formed on the silicon substrate by reacting the reactant with the adsorption film, and, at the same time, nitrogen is incorporated into the oxide layer formed along the surface. The adsorption film may be formed by providing a metal precursor onto the silicon substrate, adsorbing the metal precursor on a surface of the silicon substrate, and exhausting remaining metal precursor from the silicon substrate. In a preferred embodiment, the metal precursor may include trimethyl aluminum (TMA) or hafnium t-butoxide. Generating the ozone, providing the reactant, and forming the oxide layer on the silicon substrate may be repeatedly performed. The second flow rate may be about 2% relative to the first flow rate. The reactant may include nitrogen molecules, activated nitrogen ions or activated radicals having nitrogen. In accordance with the invention, the oxide layer may be formed at a rate of more than about 5 Å/cycle.

In accordance with another aspect of the present invention, there is provided a method of forming a metal oxide layer on a substrate. In one embodiment of the method, ozone is generated by reacting an oxygen gas having a first flow rate with a nitrogen gas having a second flow rate, the second flow rate being more than about 1%, preferably about 1–20%, more preferably 2–20%, relative to that of the first flow rate, to form a reactant stream including ozone and nitrogen. The reactant and a metal precursor are provided onto a silicon substrate. A metal oxide layer is formed on the silicon substrate by reacting the reactant with the metal precursor, and, at the same time, nitrogen is incorporated into the oxide layer formed along the surface.

In a preferred embodiment, the metal precursor may include trimethyl aluminum (TMA) or hafnium t-butoxide. Generating the ozone, providing the reactant, and forming the oxide layer on the silicon substrate may be repeatedly performed. The second flow rate may be about 2% relative to the first flow rate. The reactant may include nitrogen molecules, activated nitrogen ions or activated radicals having nitrogen.

According to the present invention, a flow rate of a nitrogen gas is increased while ozone serving as an oxidant is formed by reacting the nitrogen gas with an oxygen gas. Thus, an oxide layer or a metal oxide layer having nitrogen incorporated therein may be rapidly formed on a substrate using a reactant including ozone and nitrogen. As a result, a dielectric layer having superior performance properties relative to the conventional dielectric layers may be formed as a result of including nitrogen gas in the reactant mixture without any additional process.

BRIEF DESCRIPTION OF THE DRAWINGS

The above and other features and advantages of the invention will become readily apparent by reference to the following detailed description when considered in conjunction with the accompanying drawings.

DESCRIPTION OF THE PREFERRED EMBODIMENTS

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this closure will be thorough and complete, and will fully convey the scope of the invention to those skilled in the art.

Figure 1:
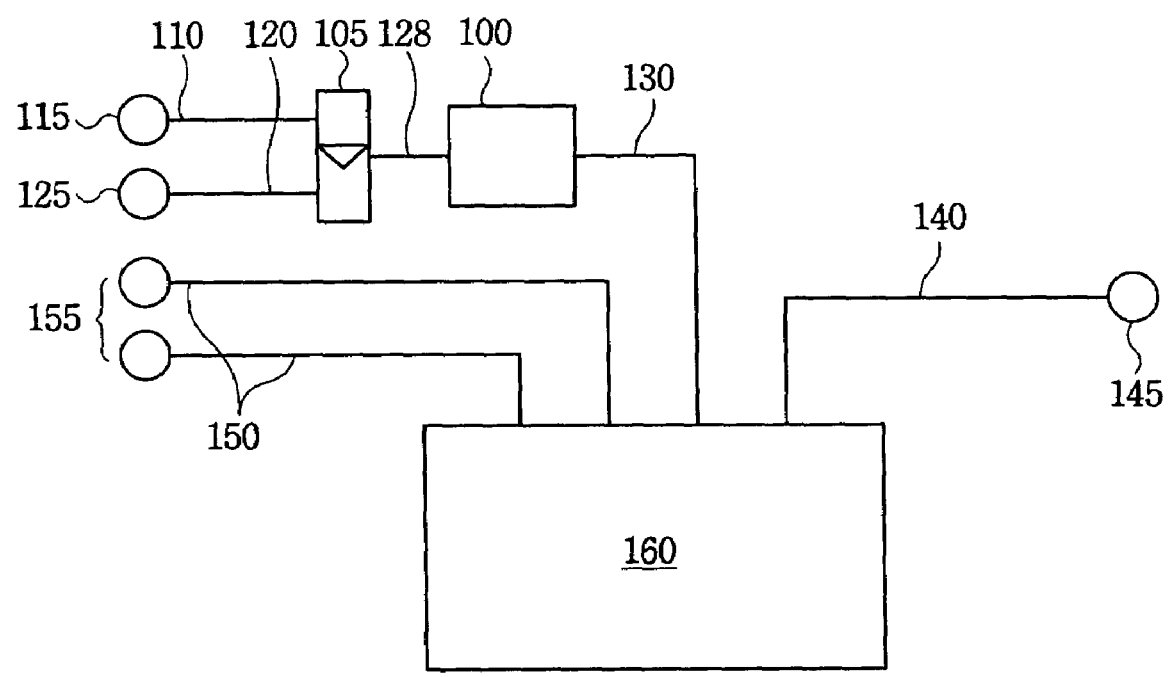
FIG. 1 is a schematic cross-sectional view illustrating an apparatus for forming an oxide layer in accordance with one embodiment of the present invention.

FIG. 1 is a schematic cross-sectional view illustrating an apparatus for forming an oxide film in accordance with one embodiment of the present invention.

Referring to FIG. 1, an apparatus for forming an oxide film includes an ozone generator 100, a mass flow controller (MFC) 105, and a reaction chamber 160.

An oxygen gas source 115 is connected to the MFC 105 through a first supply line 110 having a first nozzle. The oxygen gas source 115 provides an oxygen ($O_2$) gas into the ozone generator 100 through the MFC 105. A nitrogen gas source 125 is connected to the MFC 105 through a second supply line 120 having a second nozzle. The nitrogen gas source 115 provides a nitrogen ($N_2$) gas into the ozone generator through the MFC 105. The MFC 105 is connected to the ozone generator 100 through a third supply line 128. Hence, the oxygen gas source 115 is connected to the ozone generator 100 through the first supply line 110, the MFC 105 and the third supply line 128. In addition, the nitrogen gas source 125 is connected to the ozone generator 100 through the second supply line 120, the MFC 105 and the third supply line 128.

The MFC 105 controls flow rates of the oxygen gas and the nitrogen gas introduced into the ozone generator 100. In one embodiment, the flow rate of the nitrogen gas is greater than about 1% of the flow rate of the oxygen gas. In one particular embodiment, the flow rate of the nitrogen gas is greater than about 2% of the flow rate of the oxygen gas. A flow rate ratio between the nitrogen gas and the oxygen gas, however, may be varied according to the particular requirement of the process being performed.

A fourth supply line 130 including a third nozzle is disposed between the ozone generator 100 and the reaction chamber 160. The third supply line 130 provides ozone ($O_3$) from the ozone generator 100 to the reaction chamber 160.

A purge gas source 145 is connected to the reaction chamber 160 through a fifth supply line 140 having a fourth nozzle. The purge gas source 145 provides a purge gas into the reaction chamber 160 through the fifth supply line 140.

A plurality of reaction gas sources 155 are connected to the reaction chamber 160 through sixth supply lines 150, respectively. The reaction gas sources 155 provide reaction gases into the reaction chamber 160 through the sixth supply lines 150. Each of the sixth supply lines 150 includes a fifth nozzle.

Hereinafter, a method of oxidizing a silicon substrate in accordance with one embodiment of the present invention will be described.

In this embodiment, an oxidant for oxidizing a silicon substrate includes ozone.

The ozone is generated in the ozone generator 100 using the oxygen gas and the nitrogen gas provided from the oxygen gas source 115 and the nitrogen gas source 125, respectively. The MFC 105 controls flow rates of the oxygen gas and the nitrogen gas that are introduced into the ozone generator 100. In one embodiment, the flow rate of the nitrogen gas is greater than about 1% of the flow rate of the oxygen gas. In one particular embodiment, the flow rate of the nitrogen gas is about 2% of the flow rate of the oxygen gas. However, a flow rate ratio between the nitrogen gas and the oxygen gas may be varied according to the particular requirement of the process being performed.

Ozone is generated in accordance with the reaction between the oxygen gas and the nitrogen gas in the ozone generator 100. After generating ozone in the ozone generator 100, the nitrogen gas remains as nitrogen molecules, activated nitrogen ions or activated radicals including nitrogen in the ozone generator 100. Thus, a reactant including ozone and nitrogen is provided from the ozone generator 100 through the fourth supply line 130 onto the silicon substrate positioned in the reaction chamber 160.

While constant pressure and temperature of the reaction chamber 160 are maintained, a surface portion of the silicon substrate is oxidized by the reactant including ozone and nitrogen. Hence, a silicon oxide ($SiO_2$) film is formed on the silicon substrate in accordance with the reaction between the reactant and silicon contained in the silicon substrate. Here, the silicon oxide film includes nitrogen since the reactant includes nitrogen. The pressure and the temperature of the reaction chamber 160 may be adjusted according to the characteristics of the silicon oxide film formed on the silicon substrate.

According to the present embodiment, the temperature of the reaction chamber 160 including the silicon substrate is maintained so that the reactant is chemisorbed and physisorbed on the surface of the silicon substrate while substantially constant pressure of the reaction chamber 160 is maintained.

A metal precursor is introduced onto the silicon substrate. Since the silicon substrate in the reaction chamber is heated at a predetermined temperature, the metal precursor reaches the surface of the silicon substrate, and then the metal precursor is chemisorbed and physisorbed on the surface of the silicon substrate to thereby form an adsorption film on the silicon substrate. After the adsorption film is formed on the silicon substrate, remaining metal precursor in the reaction chamber 160 is exhausted from the reaction chamber 160.

The reactant including ozone and nitrogen is provided onto the adsorption film formed on the silicon substrate. As described above, ozone is generated in the ozone generator 100 using the oxygen gas and the nitrogen gas. The MFC 105 controls the flow rates of the oxygen gas and the nitrogen gas introduced into the ozone generator 100. For example, the flow rate of the nitrogen gas is greater than about 1% of the flow rate of the oxygen gas. In one particular embodiment, the MFC 105 adjusts the flow rates of the oxygen gas and the nitrogen gas so that the flow rate of the nitrogen gas is about 2% of the flow rate of the oxygen gas. After generating ozone in the ozone generator 100, the nitrogen gas remains as nitrogen molecules, activated nitrogen ions or activated radicals including nitrogen in the ozone generator 100. Thus, a reactant including ozone and nitrogen is provided from the ozone generator 100 onto the adsorption film formed on the silicon substrate positioned in the reaction chamber 160.

The reactant including ozone and nitrogen is reacted with the adsorption film to form a metal oxide film on the silicon substrate. The metal oxide film includes nitrogen since the reactant includes nitrogen. Here, the formation rate of the metal oxide film is about 0.5 Å/cycle in accordance with the flow rate of the reactant including nitrogen. Alternatively, the metal oxide film may be formed on the silicon substrate at a rate of greater than about 2.7 Å/cycle in accordance with the variation of the flow rate of the reactant including nitrogen. Here, the temperature and the pressure of the silicon substrate are substantially identical to those of the conventional process for forming an oxide film. After the metal oxide film is formed on the silicon substrate, remaining reactant is exhausted from the reaction chamber 160. Here, a purge gas is provided from the purge gas source 145 to the reaction chamber 160 through the fifth supply line 140.

The above-described steps are repeatedly performed to form a metal oxide film having a desired thickness on the silicon substrate. The metal oxide film may function as a dielectric layer.

Hereinafter, a method of oxidizing a silicon substrate in accordance with another embodiment of the present invention will be described.

The ozone generator 100 generates ozone using an oxygen gas and a nitrogen gas provided from the oxygen gas source 115 and the nitrogen gas source 125 through the first supply line 110 and the second supply line 120, respectively. The MFC 105 controls the flow rates of the oxygen gas and the nitrogen gas introduced into the ozone generator 100. Here, the MFC 105 adjusts the flow rates of the oxygen gas and the nitrogen gas so that the flow rate of the nitrogen gas is greater than about 1%, in one particular embodiment, about 2% of the flow rate of the oxygen gas.

After generating ozone in the ozone generator 100, the nitrogen gas remains as nitrogen molecules, activated nitrogen ions or activated radicals including nitrogen in the ozone generator 100. Thus, a reactant including ozone and nitrogen is provided from the ozone generator 100 through the fourth supply line 130 onto a silicon substrate positioned in the reaction chamber 160.

A metal precursor and the reactant including ozone and nitrogen are introduced into the reaction chamber 160. The metal precursor is, for example, provided into the reaction chamber 160 from one of the reaction gas sources 155 through one of the sixth supply lines 150. A metal oxide film is formed on the silicon substrate by the reaction between the metal precursor and the reactant including ozone and nitrogen. The metal oxide film includes nitrogen since the reactant includes nitrogen. Here, the temperature and the pressure of the silicon substrate are substantially identical to those of the conventional process for forming an oxide film. After the metal oxide film is formed on the silicon substrate, remaining reactant is exhausted from the reaction chamber 160. A purge gas is provided from the purge gas source 145 to the reaction chamber 160 through the fifth supply line 140.

EXAMPLE 1

An oxygen gas ($O_2$) was provided into an ozone generator at a flow rate of about 500 sccm, and a nitrogen gas ($N_2$) was provided into the ozone generator at a flow rate of about 1 sccm. Ozone was generated in the ozone generator by the reaction between the oxygen gas and the nitrogen gas. After ozone was generated in the ozone, generator, nitrogen gas remained as nitrogen molecular, activated nitrogen ions or activated radicals including nitrogen. Thus, a reactant including ozone and nitrogen was formed in the ozone generator.

The reactant was provided onto a silicon substrate so as to oxidize a surface portion of the silicon substrate. As a result, a silicon oxide layer including nitrogen was formed on the silicon substrate in accordance with the reaction between the reactant and silicon included in the silicon substrate.

EXAMPLE 2

An oxygen gas was provided into an ozone generator at a flow rate of about 500 sccm, and a nitrogen gas was provided into the ozone generator at a flow rate of about 2 sccm. Ozone was generated in the ozone generator by the reaction between the oxygen gas and the nitrogen gas. After ozone was generated in the ozone generator, nitrogen gas remained as molecular nitrogen, activated nitrogen ions or activated radicals including nitrogen. Thus, a reactant including ozone and nitrogen was formed in the ozone generator.

The reactant was provided onto a silicon substrate to oxidize a surface portion of the silicon substrate. As a result, a silicon oxide layer including nitrogen was formed on the silicon substrate in accordance with the reaction between the reactant and silicon included in the silicon substrate.

EXAMPLE 3

An oxygen gas was provided into an ozone generator at a flow rate of about 500 sccm, and a nitrogen gas was provided into the ozone generator at a flow rate of about 4 sccm. Ozone was generated in the ozone generator by the reaction between the oxygen gas and the nitrogen gas. After ozone was generated in the ozone generator, nitrogen gas remained as molecular nitrogen, activated nitrogen ions or activated radicals including nitrogen. Thus, a reactant including ozone and nitrogen was formed in the ozone generator.

The reactant was provided onto a silicon substrate to oxidize a surface portion of the silicon substrate. As a result, a silicon oxide layer including nitrogen was formed on the silicon substrate in accordance with the reaction between the reactant and silicon included in the silicon substrate.

EXAMPLE 4

Hafnium t-butoxide was provided onto a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 1 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 50 to 120 times, a metal oxide layer including nitrogen was formed on the silicon substrate.

EXAMPLE 5

Hafnium t-butoxide was provided on a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 2 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 50 to 120 times, a metal oxide layer including nitrogen was formed on the silicon substrate.

EXAMPLE 6

Hafnium t-butoxide was provided on a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 4 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 50 to 120 times, a metal oxide layer including nitrogen was formed on the silicon substrate.

EXAMPLE 7

Hafnium t-butoxide was provided on a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 5 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 50 to 120 times, a metal oxide layer including nitrogen was formed on the silicon substrate.

EXAMPLE 8

Hafnium t-butoxide was provided on a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 10 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 40 to 80 times, a metal oxide layer including nitrogen was formed on the silicon substrate.

EXAMPLE 9

Hafnium t-butoxide was provided on a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 20 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 40 to 80 times, a metal oxide layer including nitrogen was formed on the silicon substrate.

EXAMPLE 10

Hafnium t-butoxide was provided on a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 50 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 40 to 80 times, a metal oxide layer including nitrogen was formed on the silicon substrate.

EXAMPLE 11

Hafnium t-butoxide was provided on a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 70 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 50 to 70 times, a metal oxide layer including nitrogen was formed on the silicon substrate.

EXAMPLE 12

Hafnium t-butoxide was provided on a silicon substrate after the silicon substrate was heated. The hafnium t-butoxide was chemically and physically adsorbed on a surface of the heated silicon substrate so that an adsorption film was formed on the silicon substrate. Remaining hafnium t-butoxide was exhausted from a reaction chamber using a purging gas.

Ozone was generated in an ozone generator using an oxygen gas of about 500 sccm and a nitrogen gas of about 100 sccm. Here, a reactant including ozone and nitrogen was generated in the ozone generator while ozone is formed in the ozone generator. The reactant was provided onto the adsorption film formed on the silicon substrate to thereby form a metal oxide film including nitrogen on the silicon substrate.

After repeating the above-described steps of providing hafnium t-butoxide and the reactant onto the silicon substrate about 50 to 70 times, a metal oxide layer including nitrogen was formed on the silicon substrate.

EXAMPLE 13

Trimethyl aluminum (TMA) was provided on a silicon substrate on which a metal film is formed. The TMA was chemically and physically adsorbed on the metal film formed on the silicon substrate. An oxidant was provided on chemisorbed and physisorbed TMA so that a first adsorption film was formed on the metal film. The TMA and the oxidant were repeatedly provided onto the metal film to thereby form a lower metal oxide layer having a thickness of about 32 Å on the silicon substrate.

Hafnium t-butoxide was provided onto the lower metal oxide layer. The hafnium t-butoxide was chemically and physically absorbed on the lower metal oxide layer so that a second adsorption film was formed on the lower metal oxide layer.

Ozone was generated in an ozone generator using an oxygen gas of about 500 sccm and a nitrogen gas of about 1 sccm. Here, a reactant including ozone and nitrogen was generated in the ozone generator while ozone is formed in the ozone generator. The reactant was provided onto the second adsorption film formed on the lower metal layer to thereby form an upper metal oxide film including nitrogen on the lower metal layer.

After repeating the above-described steps of providing the TMA, the oxidant, the hafnium t-butoxide and the reactant onto the lower metal oxide layer, an upper metal oxide layer having a thickness of about 28 Å was formed on the lower metal oxide layer.

A conductive layer was formed on the upper metal oxide layer using conductive polysilicon.

EXAMPLE 14

TMA was provided on a silicon substrate on which a metal film is formed. The TMA was chemically and physically adsorbed on the metal film formed on the silicon substrate. An oxidant was provided on chemisorbed and physisorbed TMA so that a first adsorption film was formed on the metal film. The TMA and the oxidant were repeatedly provided onto the metal film to thereby form a lower metal oxide layer having a thickness of about 32 Å on the silicon substrate.

Hafnium t-butoxide was provided onto the lower metal oxide layer. The hafnium t-butoxide was chemically and physically absorbed on the lower metal oxide layer so that a second adsorption film was formed on the lower metal oxide layer.

Ozone was generated in an ozone generator using an oxygen gas of about 500 sccm and a nitrogen gas of about 10 sccm. Here, a reactant including ozone and nitrogen was generated in the ozone generator while ozone is formed in the ozone generator. The reactant was provided onto the second adsorption film formed on the lower metal layer to thereby form an upper metal oxide film including nitrogen on the lower metal layer.

After repeating the above-described steps of providing the TMA, the oxidant, the hafnium t-butoxide and the reactant onto the lower metal oxide layer, an upper metal oxide layer having a thickness of about 28 Å was formed on the lower metal oxide layer.

A conductive layer was formed on the upper metal oxide layer using conductive polysilicon.

EXAMPLE 15

TMA was provided on a silicon substrate on which a metal film is formed. The TMA was chemically and physically adsorbed on the metal film formed on the silicon substrate. An oxidant was provided on chemisorbed and physisorbed TMA so that a first adsorption film was formed on the metal film. The TMA and the oxidant were repeatedly provided onto the metal film to thereby form a lower metal oxide layer having a thickness of about 32 Å on the silicon substrate.

Hafnium t-butoxide was provided onto the lower metal oxide layer. The hafnium t-butoxide was chemically and physically absorbed on the lower metal oxide layer so that a second adsorption film was formed on the lower metal oxide layer.

Ozone was generated in an ozone generator using an oxygen gas of about 500 sccm and a nitrogen gas of about 100 sccm. Here, a reactant including ozone and nitrogen was generated in the ozone generator while ozone is formed in the ozone generator. The reactant was provided onto the second adsorption film formed on the lower metal layer to thereby form an upper metal oxide film including nitrogen on the lower metal layer.

After repeating the above-described steps of providing the TMA, the oxidant, hafnium t-butoxide and the reactant onto the lower metal oxide layer, an upper metal oxide layer having a thickness of about 28 Å was formed on the lower metal oxide layer.

A conductive layer was formed on the upper metal oxide layer using conductive polysilicon.

Test for Identifying an Amount of Nitrogen Contained in an Oxide Layer in Accordance with the Flow Rate of a Nitrogen Gas In Examples 1 to 6, the amount of nitrogen contained in the oxide layers was measured by a time-of-flight secondary ion mass spectrometry (TOF-SIMS) method.

Figure 2:
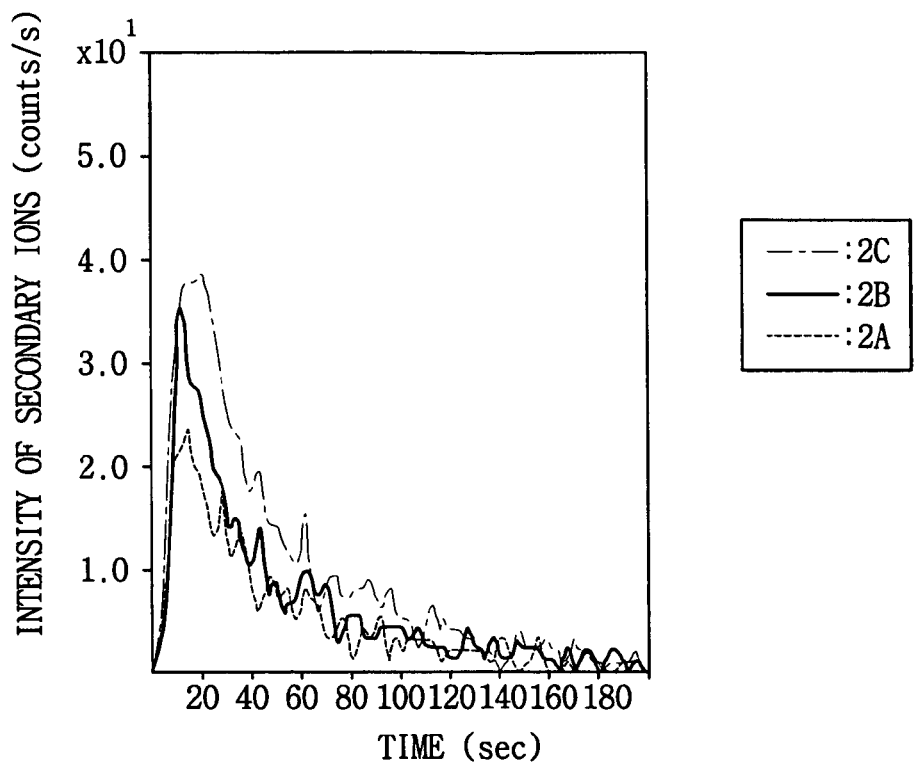
FIG. 2 is a graph illustrating intensities of secondary ions relative to time in accordance with Examples 1 to 3.

FIG. 2 is a graph illustrating intensities of secondary ions relative to time in accordance with Examples 1 to 3.

Referring to FIG. 2, beams of primary ions having high energy were irradiated onto the silicon oxide layers of Examples 1 to 3, respectively. Secondary ions generated by irradiating beams of the primary ions were measured relative to a time. The silicon oxide layer 2B of Example 2 and the silicon oxide layer 2C of Example 3 emitted the secondary ions more than the silicon oxide layer 2A of Example 1. Here, the number of the secondary ions indicates the amount of nitrogen contained in the silicon oxide layer. Therefore, when the flow rate of the nitrogen gas increased for generating ozone, the amount of nitrogen contained in the silicon oxide layer also increased.

Figure 3:
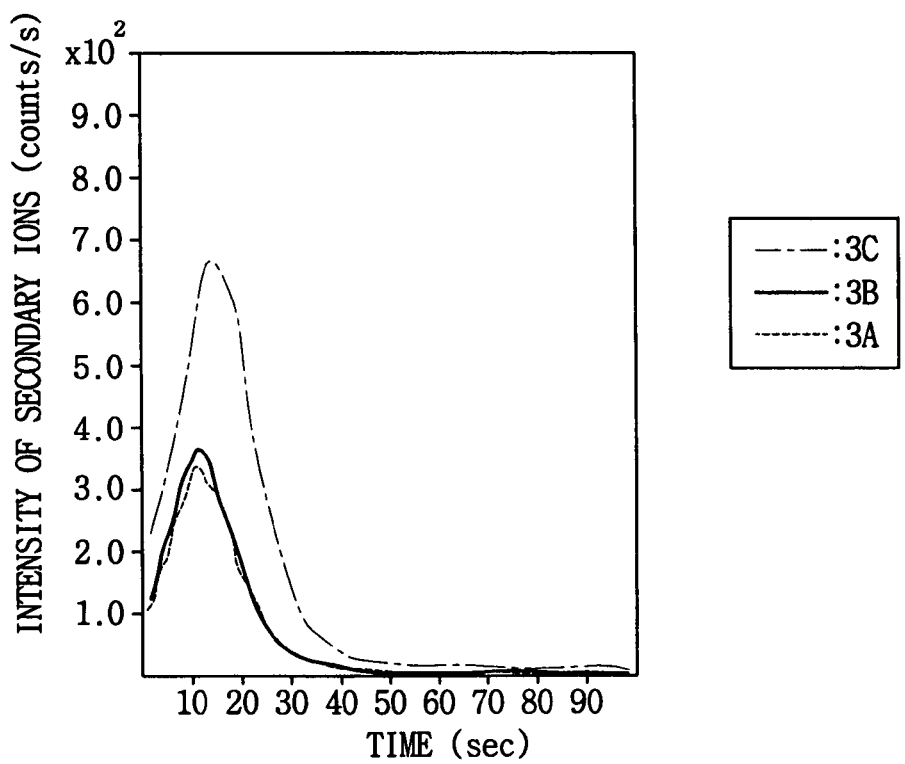
FIG. 3 is a graph illustrating intensities of secondary ions relative to time in accordance with Examples 4 to 6.

FIG. 3 is a graph illustrating intensities of secondary ions relative to time in accordance with Examples 4 to 6.

Referring to FIG. 3, the metal oxide layer 3B of Example 5 and the metal oxide layer 3C of Example 6 emitted secondary ions more than the metal oxide layer 3A of Example 4. The number of the secondary ions indicates the amount of nitrogen contained in the metal oxide layer. Therefore, when the flow rate of the nitrogen gas increased for generating ozone used in the formation of the metal oxide layer, the amount of nitrogen contained in the metal oxide layer also increased.

In Examples 4, 8 and 12, the amount of nitrogen contained in the metal oxide layers was measured by an X-ray photoelectronic spectroscopy (XRS) method. Here, variations of bonding energy of hafnium (Hf), oxygen and carbon included in the metal oxide layers of Examples 4, 8 and 12 were measured. Measured bonding energy was analyzed using the data disclosed in "Energy Gap and Band Alignment for $HfO_2$ and $Al_2O_3$ on 100 Si (Applied Physics Letter, Vol. 81, Num. 2)".

Figure 4A:
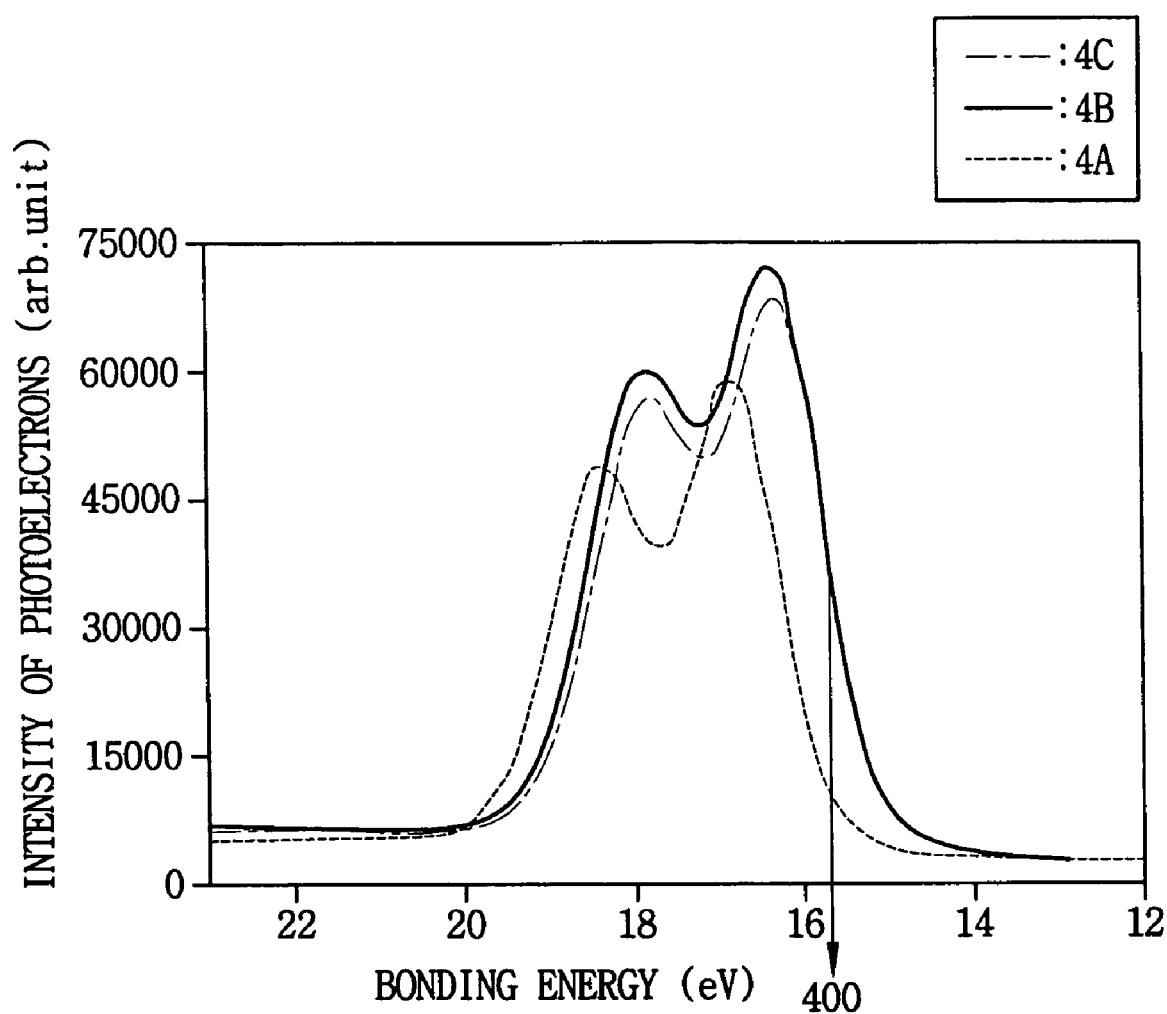
FIG. 4A is a graph illustrating bonding energy of hafnium in metal oxide layers relative to intensity of photoelectrons in accordance with Examples 4; 8 and 12.

FIG. 4A is a graph illustrating bonding energy of hafnium in the metal oxide layers relative to intensity of photoelectrons in accordance with Examples 4, 8 and 12. In FIG. 4A, 4 s peak of hafnium was measured by the XPS method.

Referring to FIG. 4A, the metal oxide layer 4A of Example 4 indicated bonding energy substantially identical to that of hafnium oxide ($HfO_2$) layer. Meanwhile, the metal oxide layer 4B of Example 8 and the metal oxide layer 4C of Example 12 represented bonding energy relatively lower than that of the metal oxide layer 4A of Example 4. According to the above-mentioned data, the bonding energy of hafnium nitride (HfN) 400 is about 17.1 eV. Therefore, the bonds of hafnium nitride were considerably generated in the metal oxide layers 4B of Example 8 and the metal oxide layer 4C of Example 12 instead of the bond of hafnium oxide.

Figure 4B:
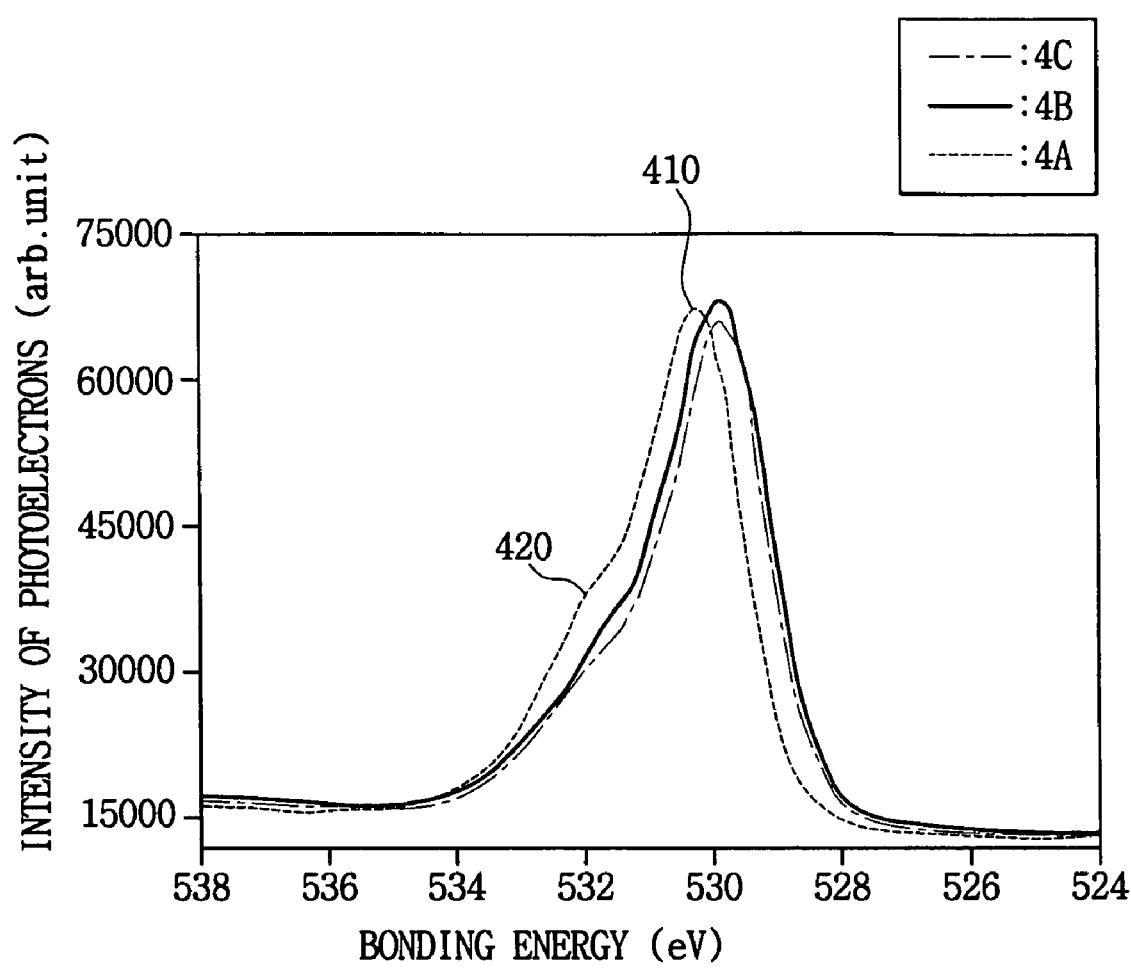
FIG. 4B is a graph illustrating bonding energy of oxygen in the metal oxide layers relative to intensity of photoelectrons in accordance with Examples 4, 8 and 12.

FIG. 4B is a graph illustrating bonding energy of oxygen in the metal oxide layers relative to intensity of photoelectrons in accordance with Examples 4, 8 and 12. In FIG. 4B, 1 s peak of oxygen was measured by the XPS method.

Referring to FIG. 4B, the metal oxide layer 4A of Example 4 had a shoulder line 420 positioned at a left side of a peak 410. The metal oxide layer 4B of Example 8 and the metal oxide layer 4C of Example 12 substantially had no shoulder lines. The shoulder line 420 indicates the bond of hafnium oxide. Therefore, when the shoulder line was not present, the bond of hafnium oxide was also decomposed. This means the reduction of an organic material including oxide that causes leakage current from the metal oxide layer when the metal oxide layer serves as a dielectric layer.

Figure 4C:
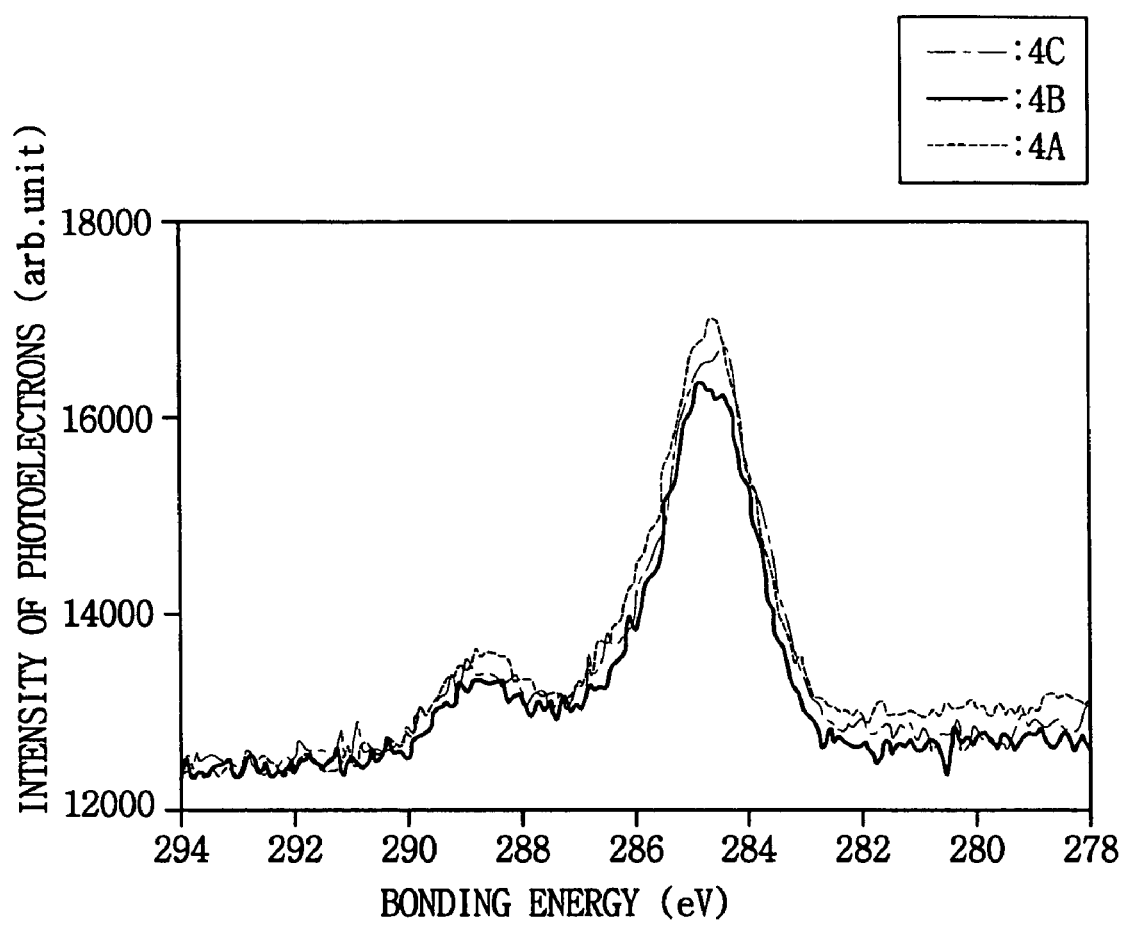
FIG. 4C is a graph illustrating bonding energy of carbon in the metal oxide layers relative to intensity of photoelectrons in accordance with Examples 4, 8 and 12.

FIG. 4C is a graph illustrating bonding energy of carbon in the metal oxide layers relative to intensity of photoelectrons in accordance with Examples 4, 8 and 12. In FIG. 4C, 1 s peak of carbon was measured by the XPS method.

Referring to FIG. 4C, the metal oxide layer 4B of Example 8 had a peak lower than that of the metal oxide layer 4A of Example 4, and the metal oxide layer 4C of Example 12 had a peak lower than that of the metal oxide layer 4B of Example 8. Thus, the amount of an organic material including carbon was decreased in Examples 8 and 12.

As described above, the amount of nitrogen increases in the metal oxide layer in accordance with the increase of the nitrogen gas when the metal oxide layer is formed using ozone generated by reacting the oxygen gas and the nitrogen gas. In addition, the organic material included in the metal oxide layer may decrease in accordance with the increase of the nitrogen gas.

Figure 5A:
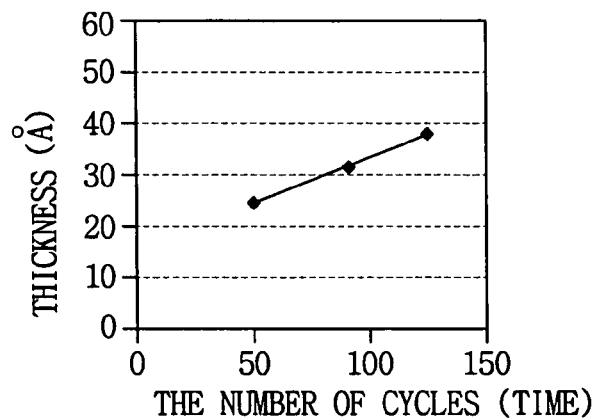
FIG. 5A is a graph illustrating the formation rate of the metal oxide layer of Example 4.
Figure 5B:
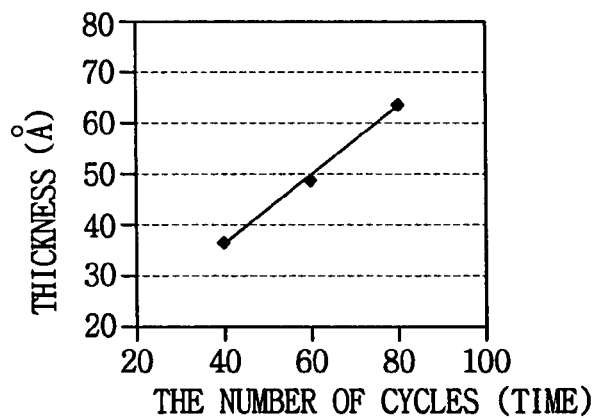
FIG. 5B is a graph illustrating the formation rate of the metal oxide layer of Example 8.
Figure 5C:
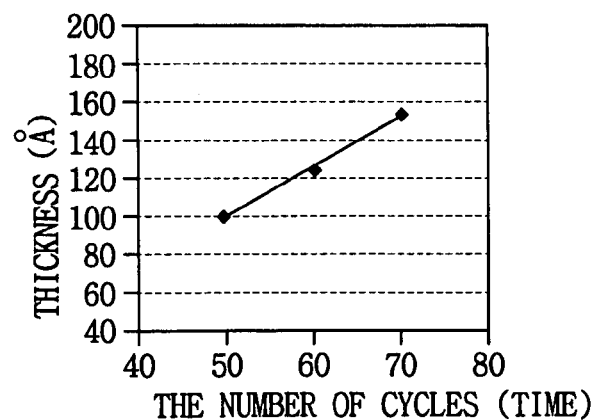
FIG. 5C is a graph illustrating the formation rate of the metal oxide layer of Example 12.

Test for Identifying the Formation Rate of an Oxide Layer in Accordance with the Flow Rate of a Nitrogen Gas FIG. 5A is a graph illustrating the formation rate of the metal oxide layer of Example 4, FIG. 5B is a graph illustrating the formation rate of the metal oxide layer of Example 8, and FIG. 5C is a graph illustrating the formation rate of the metal oxide layer of Example 12. In FIGS. 5A to 5C, the formation rates of the metal oxide layers of Examples 4, 8 and 12 were measured by varying the number of cycles for forming the metal oxide layer.

Referring to FIGS. 5A to 5C, the formation rate of the metal oxide layer of Example 4 was about 0.2 Å/cycle and the formation rate of the metal oxide layer of Example 8 was about 0.7 Å/cycle. Meanwhile, the formation rate of the metal oxide layer of Example 12 was about 2.7 Å/cycle. Therefore, the formation rate of the metal oxide layer increases in accordance with the increase of the nitrogen gas when the metal oxide layer is formed using the oxygen gas of about 500 sccm and the nitrogen gas.

Figure 6:
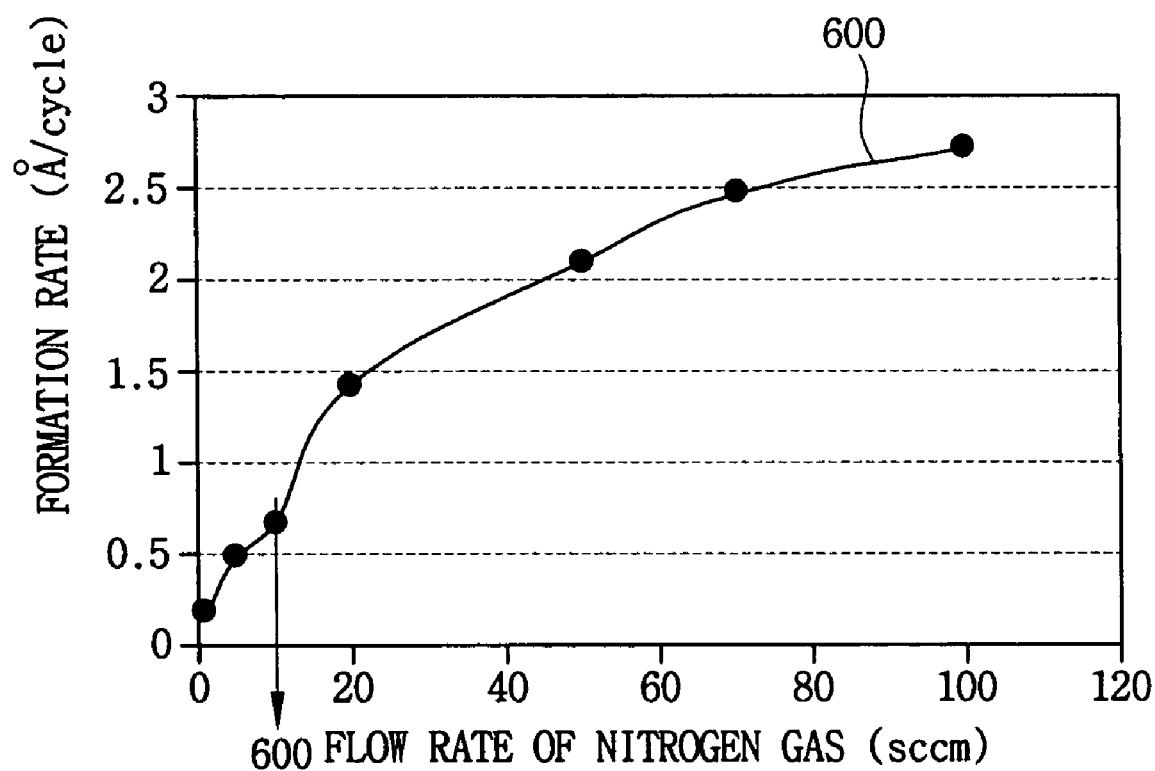
FIG. 6 is a graph illustrating the formation rates of the metal oxide layers of Examples 4 and 7 to 12.

FIG. 6 is a graph illustrating the formation rates of the metal oxide layers of Examples 4 and 7 to 12.

Referring to FIG. 6, the formation rates of the metal oxide layers were increased in accordance with the augmentation of the flow rate of the nitrogen gas. For example, the metal oxide layer was advantageously formed using the oxygen gas of about 500 sccm and the nitrogen gas of about 5 sccm. Here, the flow rate of the nitrogen gas is about 1% that of the oxygen gas.

As shown in FIG. 6, the formation rate of the metal oxide layer rapidly varied from the critical point 600 in which the flow rate of the nitrogen gas was about 10 sccm. That is, the formation rate of the metal oxide layer was rapidly increased from the critical point 600. Hence, the metal oxide layer was preferably formed using the oxygen gas of about 500 sccm and the nitrogen gas of more than about 10 sccm. Here, the flow rate of the nitrogen gas is more than about 2% that of the oxygen gas. For example, the formation rate of the metal oxide layer of Example 13 was about thirteen times greater than the formation rate of the metal oxide layer of Example 4. Therefore, when the flow rate of the nitrogen gas increases for forming the metal oxide layer, the formation rate of the metal oxide layer may be greatly increased in comparison with the conventional method of forming a metal oxide layer.

Test for Identifying a Leakage Current from an Oxide Layer in Accordance with a Flow Rate of a Nitrogen Gas The electrical characteristics of the oxide layers of Examples 1 to 3 were measured. Here, each of the oxide layers had an area of about $1.85 \times 10^{-4}$ cm$^2$.

Figure 7A:
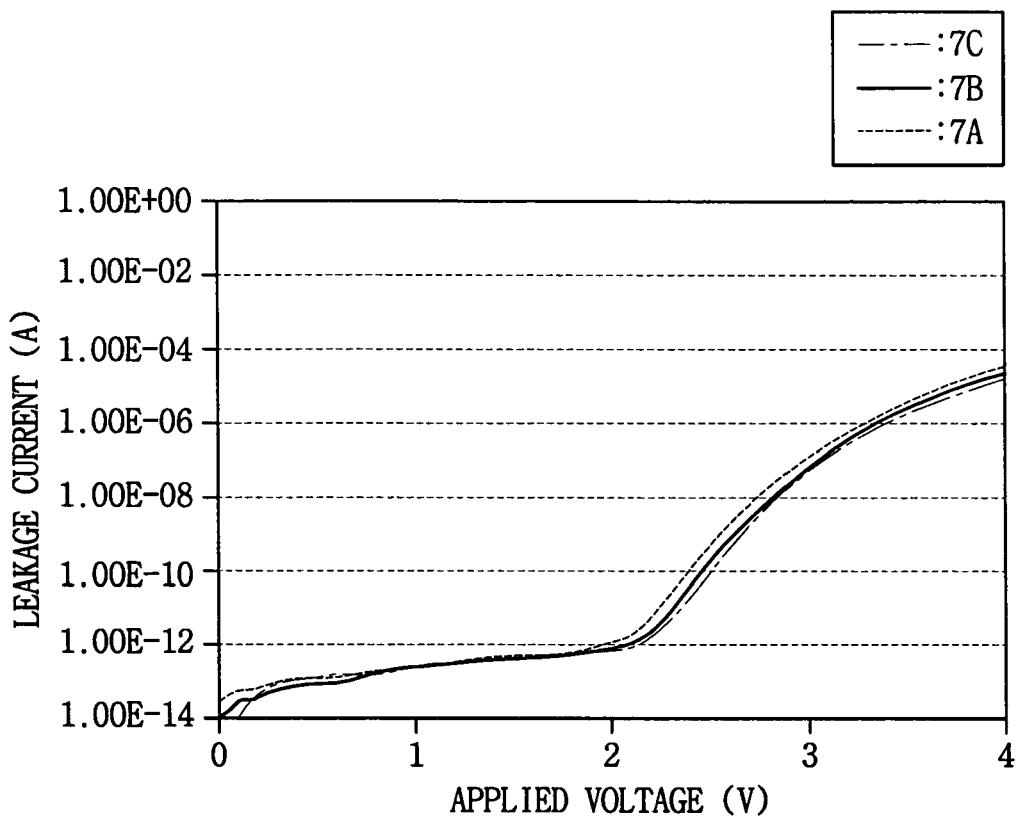
FIG. 7A is a graph illustrating leakage currents of the oxide layers of Examples 1 to 3 relative to applied voltages.
Figure 7B:
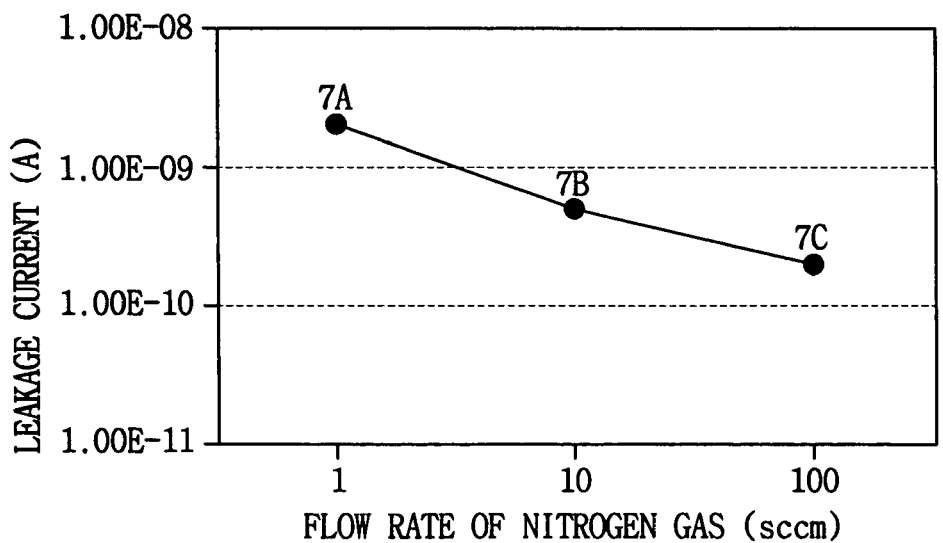
FIG. 7B is a graph illustrating the leakage currents of the oxide layers of Examples 1 to 3 relative to the flow rates of the nitrogen gas when the applied voltage is about 2.5V.

FIG. 7A is a graph illustrating leakage currents of the oxide layers of Examples 1 to 3 relative to applied voltages, and FIG. 7B is a graph illustrating the leakage currents of the oxide layers of Examples 1 to 3 relative to the flow rates of the nitrogen gas when the applied voltage is about 2.5V.

Referring to FIG. 7A, the leakage current of the oxide layer 7A of Example 1 was relatively greater than that of the oxide layer 7B of Example 2, whereas the leakage current of the oxide layer 7B of Example 2 was relatively greater than that of the oxide layer 7C of Example 3. Therefore, the leakage current of the oxide layer was decreased when the flow rate of the nitrogen gas was increased.

Referring to FIG. 7B, when the applied voltage was about 2.5V, the leakage current of the oxide layer 7A of Example 1 was greater than that of the oxide layer 7B of Example 2, whereas the leakage current of the oxide layer 7B of Example 2 was greater than that of the oxide layer 7C of Example 3. For example, the leakage current of the oxide layer 7A of Example 1 was about ten times greater than the leakage current of the oxide layer 7C of Example 3. When the oxide layer may have an area of more than about $1.85 \times 10^{-4}$ cm$^2$, the leakage current of the oxide layer serving as a dielectric layer may be greatly reduced.

As described above, an excellent oxide layer may be formed using ozone in accordance with the flow rate increase of the nitrogen gas when ozone is formed by reacting the nitrogen gas with the oxygen gas.

According to the present invention, a flow rate of a nitrogen gas is increased while ozone serving as an oxidant is formed by reacting the nitrogen gas with an oxygen gas. Thus, an oxide layer or a metal oxide layer including nitrogen may be rapidly formed on a substrate using a reactant including ozone and nitrogen. As a result, an excellent dielectric layer may be formed in accordance with the flow rate increase of the nitrogen gas without any additional process.

While this invention has been particularly shown and described with reference to preferred embodiments thereof, it will be understood by those skilled in the art that various changes in form and details may be made therein without departing from the spirit and scope of the invention as defined by appended claims.

What is claimed is:

1. A method of oxidizing a silicon substrate comprising:
   generating ozone by reacting an oxygen gas having a first flow rate with a nitrogen gas having a second flow rate of greater than about 1% of the first flow rate;
   providing a reactant including the ozone and nitrogen onto a silicon substrate; and
   oxidizing a surface of the silicon substrate by reacting the reactant with silicon included in the silicon substrate.

2. The method of claim 1, wherein the second flow rate is about 2% of the first flow rate.

3. The method of claim 1, wherein the reactant comprises nitrogen molecules, activated nitrogen ions or activated radicals including nitrogen.

4. A method of forming an oxide layer on a substrate comprising:
   generating ozone by reacting an oxygen gas having a first flow rate with a nitrogen gas having a second flow rate of greater than about 1% of the first flow rate;
   providing a reactant including the ozone and nitrogen onto an adsorption film formed on a silicon substrate; and
   forming an oxide layer on the silicon substrate by reacting the reactant with the adsorption film.

5. The method of claim 4, wherein the second flow rate is about 2% of the first flow rate.

6. The method of claim 4, wherein the reactant comprises nitrogen molecules, activated nitrogen ions or activated radicals including nitrogen.

7. The method of claim 4, wherein the oxide layer is formed at a rate of more than about 0.5 Å/cycle.

8. The method of claim 4, wherein the adsorption film is formed by providing a metal precursor onto the silicon substrate, adsorbing the metal precursor on a surface of the silicon substrate, and exhausting remaining metal precursor from the silicon substrate.

9. The method of claim 8, wherein the metal precursor comprises trimethyl aluminum (TMA) or hafnium t-butoxide.

10. The method of claim 4, wherein generating the ozone, providing the reactant, and forming the oxide layer on the silicon substrate are repeatedly performed.

11. A method of forming a metal oxide layer on substrate comprising:

generating ozone by reacting an oxygen gas having a first flow rate with a nitrogen gas having a second flow rate of more than about 1% of the first flow rate;

providing a metal precursor and a reactant including the ozone and nitrogen onto a silicon substrate; and forming a metal oxide layer on the silicon substrate by reacting the reactant with the metal precursor.

12. The method of claim 11, wherein the second flow rate is about 2% of the first flow rate.

13. The method of claim 11, wherein the reactant comprises nitrogen molecules, activated nitrogen ions or activated radicals including nitrogen.

14. The method of claim 11, wherein the metal precursor comprises trimethyl aluminum (TMA) or hafnium t-butoxide.

* * * * *